US009350317B2

(12) United States Patent
Ao-Ieong et al.

(10) Patent No.: US 9,350,317 B2
(45) Date of Patent: May 24, 2016

(54) EMI SUPPRESSION DEVICE AND METHOD FOR NETWORK TRANSMISSION

(71) Applicant: REALTEK SEMICONDUCTOR CORPORATION, Hsinchu (TW)

(72) Inventors: Iat-In Ao-Ieong, Hsinchu (TW); Chen-Chih Huang, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 20 days.

(21) Appl. No.: 14/593,879

(22) Filed: Jan. 9, 2015

(65) Prior Publication Data

US 2015/0200644 A1 Jul. 16, 2015

(30) Foreign Application Priority Data

Jan. 13, 2014 (TW) .............................. 103101096 A
May 22, 2014 (TW) .............................. 103117842 A (51) Int. Cl.
*H04B 3/28* (2006.01)
*H03H 7/42* (2006.01)

(52) U.S. Cl.
CPC ..................... *H03H 7/427* (2013.01)

(58) Field of Classification Search
CPC ....................................................... H03H 7/427
USPC ............................................................ 333/12
See application file for complete search history.

(56) References Cited

U.S. PATENT DOCUMENTS

| 7,696,836 | B2 * | 4/2010 | Nguyen | H01P 5/10 |
| | | | | 333/177 |
| 8,050,399 | B2 | 11/2011 | Tsai et al. | |
| 8,836,448 | B2 * | 9/2014 | Zhang | H03H 7/09 |
| | | | | 333/177 |
| 9,246,464 | B2 * | 1/2016 | Zhang | H03H 7/09 |
| 2007/0297201 | A1 * | 12/2007 | Lee | H04L 25/0266 |
| | | | | 363/21.06 |

FOREIGN PATENT DOCUMENTS

TW            I318063          12/2009

OTHER PUBLICATIONS

U.S. Pat. No. 8050399 is the counterpart for TW I318063 listed above.

* cited by examiner

*Primary Examiner* — Robert Pascal
*Assistant Examiner* — Kimberly Glenn
(74) *Attorney, Agent, or Firm* — WPAT, P.C., Intellectual Property Attorneys; Anthony King (57) ABSTRACT

The present invention discloses an EMI suppression device, comprising: a first transformer including a first circuit-end central tap to receive a first circuit signal from two first circuit-end signal taps, and a first cable-end central tap to receive a first cable signal from two first cable-end signal taps; a second transformer including a second circuit-end central tap to receive a second circuit signal from two second circuit-end signal taps, and a second cable-end central tap to receive a second cable signal from two second cable-end signal taps; a first circuit-end inductor coupled between the first circuit-end central tap and a system ground to reduce the common mode noise of the first circuit signal; and a second circuit-end inductor coupled between the second circuit-end central tap and the system ground to reduce the common mode noise of the second circuit signal. Said first and second circuit-end inductors operate separately.

10 Claims, 5 Drawing Sheets

EMI SUPPRESSION DEVICE AND METHOD FOR NETWORK TRANSMISSION

BACKGROUND OF THE INVENTION

1. Field of the Invention

The present invention relates to an EMI suppression device and method, especially to an EMI suppression device and method for network transmission.

2. Description of Related Art

In consideration of that an unshielded twisted pair cable is vulnerable to the influence of common mode noise which may cause electromagnetic interference (EMI), a common mode termination design is adopted for EMI suppression. Common mode termination is accomplished by depleting the common mode energy of a twisted pair cable. In most cases, a central tap of one winding of a normal transformer connected with a twisted pair cable is coupled to a ground through a matching impedance (e.g. a resistor of 75 ohm) and a capacitor, so as to deplete the common mode energy; however, this manner doesn't work well, and thus some product under a strict specification has to use an expensive high-performance transformer instead to pass in an EMI test.

People who are interested in the prior art may refer to the following document: Taiwan patent of patent number I318063.

SUMMARY OF THE INVENTION

In light of the problems of the prior art, an object of the present invention is to provide an EMI suppression device and method capable of improving the prior art.

The present invention discloses an EMI suppression device for network transmission. An embodiment of the EMI suppression device comprises: a first transformer, a second transformer, a first circuit-end inductance element and a second circuit-end inductance element. Said first transformer includes a first circuit-end central tap operable to receive a first circuit signal from two first circuit-end signal taps, and a first cable-end central tap operable to receive a first cable signal from two first cable-end signal taps. Said second transformer includes a second circuit-end central tap operable to receive a second circuit signal from two second circuit-end signal taps, and a second cable-end central tap operable to receive a second cable signal from two second cable-end signal taps. Said first circuit-end inductance element is coupled between the first circuit-end central tap and a system ground and operable to reduce the common mode noise of the first circuit signal. Said second circuit-end inductance element is coupled between the second circuit-end central tap and the system ground and operable to reduce the common mode noise of the second circuit signal. Furthermore, the first and second circuit-end inductance elements are independent of each other and operate separately.

Another embodiment of the said EMI suppression device comprises: a first transformer; a first cable-end inductance element; and a first circuit-end inductance element. Said first transformer includes a first cable-end central tap operable to receive a first cable signal from two first cable-end signal taps, and a first circuit-end central tap operable to receive a first circuit signal from two first circuit-end signal taps. Said first cable-end inductance element is coupled between the first cable-end central tap and a chassis ground and operable to reduce the common mode noise of the first cable signal. Said first circuit-end inductance element is coupled between the first circuit-end central tap and a system ground and operable to reduce the common mode noise of the first circuit signal.

The present invention also discloses an EMI suppression method for network transmission, which is capable of determining the inductance of an inductance element for EMI suppression. An embodiment of the EMI suppression method comprises the following steps: electrically connecting at least one first central tap of a first transformer with at least one first inductance element, and electrically connecting two first signal taps of the first transformer with a first pair of wire; electrically connecting two second signal taps of a second transformer with a second pair of wire; electrically connecting two third signal taps of a third transformer with a third pair of wire; electrically connecting two fourth signal taps of a fourth transformer with a fourth pair of wire; and determining the inductance of the at least one first inductance element according to at least one of the following characteristic impedances: the characteristic impedance derived from the first and second pairs of wire, the characteristic impedance derived from the first pair of wire and the parallel connection of the second and third pairs of wire, the characteristic impedance derived from the first pair of wire and the parallel connection of the second, third and fourth pairs of wire, and the characteristic impedance derived from the parallel connection of the first and second pairs of wire and the parallel connection of the third and fourth pairs of wire.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this invention field. If any term is defined in this specification, such term should be explained accordingly. Besides, the connection between objects or events in the disclosed embodiments can be direct or indirect provided that these embodiments are still practicable under such connection. Said "indirect" means that an intermediate object or a physical space exists between the objects, or an intermediate event or a time interval exists between the events.

The present invention includes an electromagnetic interference (EMI) suppression device and method applicable to an integrated circuit (e.g. an Ethernet integrated circuit) or a system device (e.g. an Ethernet device); said EMI suppression device and method could be carried out with components or steps equivalent to those described in this specification as long as the consequent implementation is practicable. Please note that some element itself of the EMI suppression device could be known, and thus the detail of such element will be omitted provided that this omission nowhere dissatisfies the disclosure and enablement requirements. Please also note that the EMI suppression method can be in the form of software and/or firmware and carried out by the EMI suppression device of the present invention or its equivalent; therefore the following description will abridge the hardware details for executing the method but put the emphasis on the steps. Besides, each embodiment in the following description includes one or more features, but this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility in carrying out the present invention.

Figure 1:
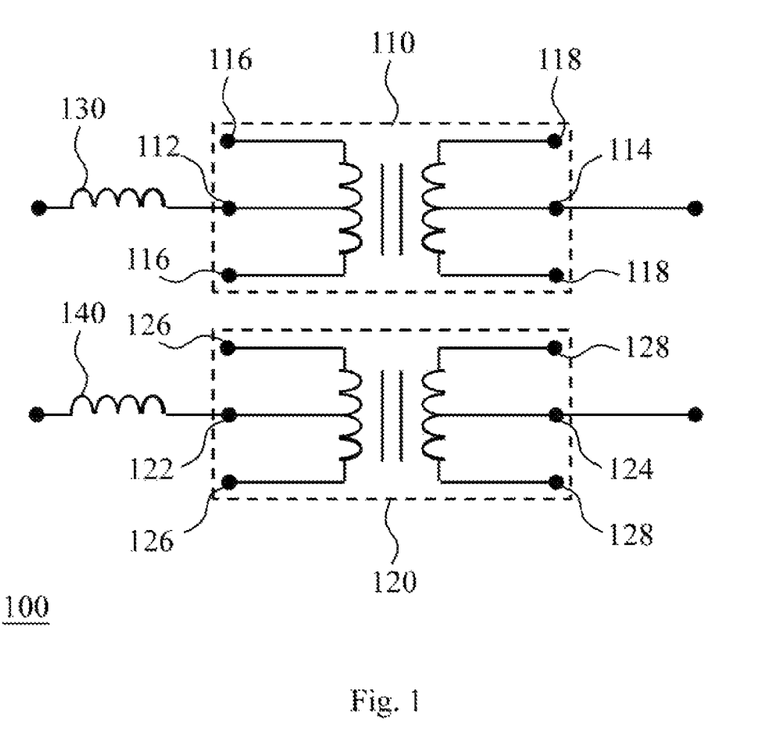
FIG. 1 illustrates an embodiment of the EMI suppression device of the present invention for network transmission.

Please refer to FIG. 1 which illustrates an embodiment of the EMI suppression device of the present invention for network transmission. As it is shown in FIG. 1, the EMI suppression device 100 comprises: a first transformer 110, a second transformer 120, a first circuit-end inductance element 130, and a second circuit-end inductance element 140 in which the term "circuit-end" indicates the side of a transformer (e.g. the first transformer 110) operable to be connected with a circuit board. Said first transformer 110 includes: a first circuit-end central tap 112 operable to receive a first circuit signal from two first circuit-end signal taps 116; and a first cable-end central tap 114 operable to receive a first cable signal from two first cable-end signal taps 118, wherein the term "cable-end" indicates the side of a transformer (e.g. the first transformer 110) operable to be connected with a transmission cable. Said second transformer 120 includes a second circuit-end central tap 122 operable to receive a second circuit signal from two second circuit-end signal taps 126, and a second cable-end central tap 124 operable to receive a second cable signal from two second cable-end signal taps 128. Said first circuit-end inductance element 130 is operable to be coupled between the first circuit-end central tap 112 and a system ground (not shown) and reduce the common mode noise of the first circuit signal. Said second circuit-end 140 inductance element is operable to be coupled between the second circuit-end central tap 124 and the system ground and reduce the common mode noise of the second circuit signal. In this embodiment, the first and second circuit-end inductance elements 130, 140 are independent of each other and able to operate separately; in an alternative embodiment, the EMI suppression device 100 comprises only one of the first and second circuit-end inductance elements 130, 140 while the other configuration remains unchanged.

Figure 2:
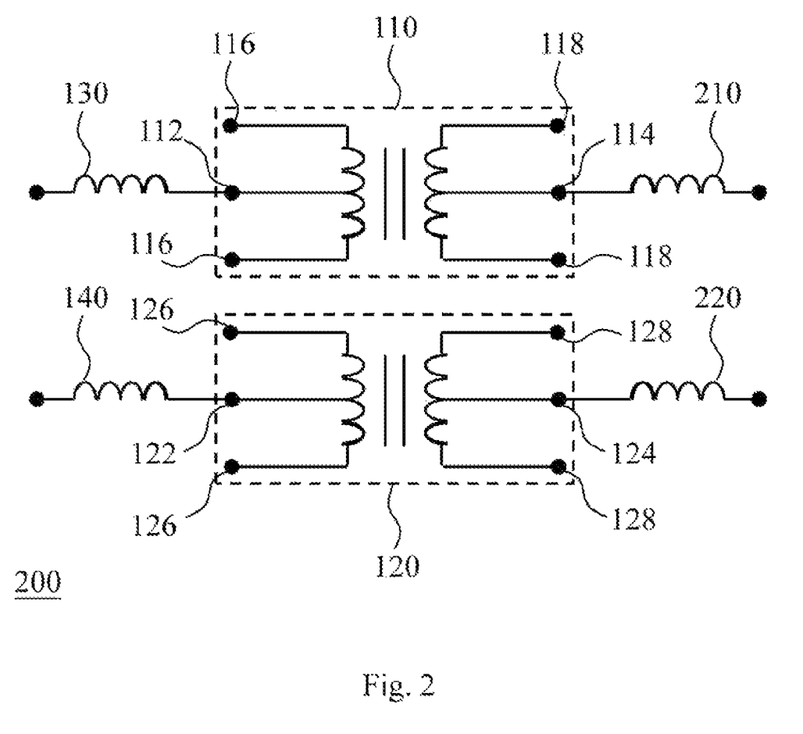
FIG. 2 illustrates another embodiment of the EMI suppression device of the present invention for network transmission.

FIG. 2 illustrates another embodiment of the EMI suppression device of the present invention. As it is shown in FIG. 2, in addition to the components in FIG. 1, the EMI suppression device 200 further comprises: a first cable-end inductance element 210 and a second cable-end inductance element 220. Said first cable-end inductance element 210 is operable to be coupled between the first cable-end central tap 114 and a chassis ground, and reduce the common mode noise of the first cable signal for the reduction of EMI; said second cable-end inductance element 220 is operable to be coupled between the second cable-end central tap 124 and the chassis ground, and reduce the common mode noise of the second cable signal for EMI reduction. In this embodiment, the first and second cable-end inductance elements 210, 220 are independent of each other and able to operate separately; in an alternative embodiment, the EMI suppression device 200 comprises only one of the first and second cable-end inductance elements 210, 220 while the other configuration remains the same. Please note that the said chassis ground is different from the aforementioned system ground while the definition of the two kinds of ground are known to those of ordinary skill in the art; however, providing an implementation of this embodiment is practicable, the two grounds could be a grounding path in common in such the implementation.

Figure 3:
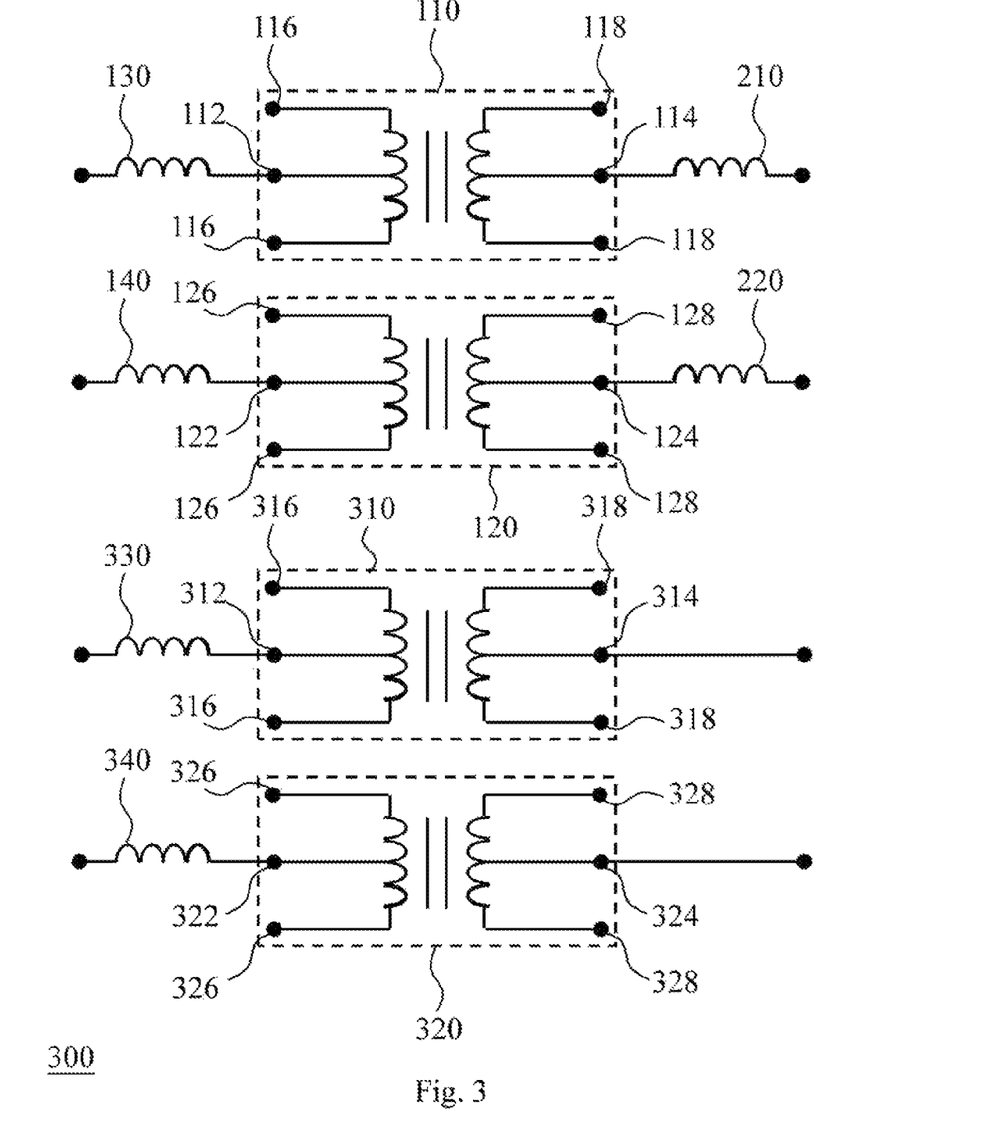
FIG. 3 illustrates yet another embodiment of the EMI suppression device of the present invention for network transmission.

FIG. 3 illustrates yet another embodiment of the EMI suppression device of the present invention. Compared with the embodiment of FIG. 2, the EMI suppression device 300 of the present embodiment additionally comprises: a third transformer 310; a fourth transformer 320; a third circuit-end inductance element 330; and a fourth circuit-end inductance element 340. Said third transformer 310 includes: a third circuit-end central tap 312 operable to receive a third circuit signal from two third circuit-end signal taps 316; and a third cable-end central tap 314 operable to receive a third cable signal from two third cable-end signal taps 318. Said fourth transformer 320 includes: a fourth circuit-end central tap 322 operable to receive a fourth circuit signal from two fourth circuit-end signal taps 326; and a fourth cable-end central tap 324 operable to receive a fourth cable signal from two fourth cable-end signal taps 328. Said third circuit-end inductance element 330 is operable to be coupled between the third circuit-end central tap 312 and the aforementioned system ground, and reduce the common mode noise of the third circuit signal. Said fourth circuit-end inductance element 340 is operable to be coupled between the fourth circuit-end central tap 322 and the system ground, and reduce the common mode noise of the fourth circuit signal. Similarly, in this embodiment the third and fourth circuit-end inductance elements 330, 340 (or the first, second, third and fourth circuit-end inductance elements 130, 140, 330, 340) are independent of each other and able to operate separately; in an alternative embodiment the EMI suppression device 300 comprises only one of the third and fourth circuit-end inductance elements 334, 340 while the other configuration is kept the same.

Figure 4:
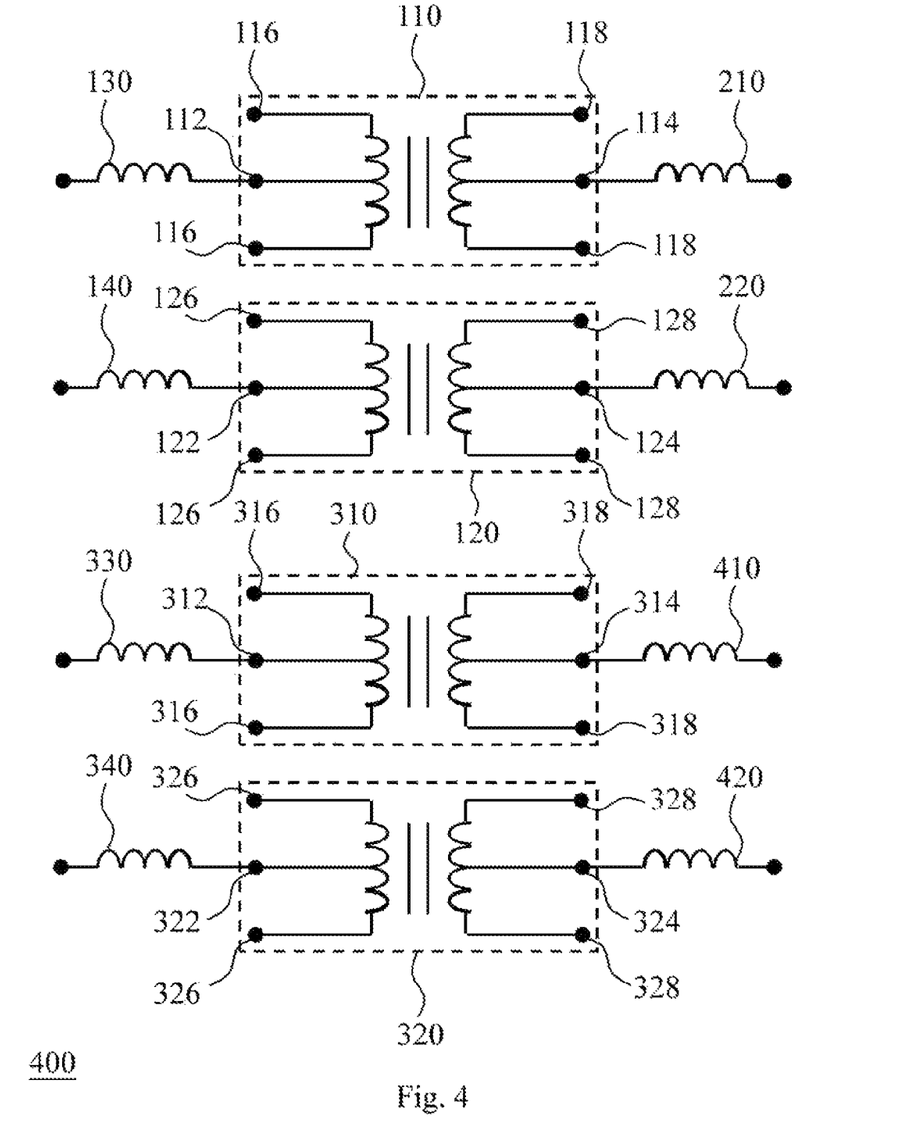
FIG. 4 illustrates a further embodiment of the EMI suppression device of the present invention for network transmission.

FIG. 4 illustrates a further embodiment of the EMI suppression device of the present invention. The EMI suppression device 400 of this embodiment comprises not only the components in FIG. 3, but also the following components: a third cable-end inductance element 410, and a fourth cable-end inductance element 420. Said third cable-end inductance element 410 is operable to be coupled between the third cable-end central tap 314 and the aforementioned chassis ground, and thereby reduce the common mode noise of the third cable signal. Said fourth cable-end inductance element 420 is operable to be coupled between the fourth cable-end central tap 324 and the chassis ground, and thereby reduce the common mode noise of the fourth cable signal. In this embodiment the said third and fourth cable-end inductance elements 410, 420 (or the first, second, third and fourth cable-end inductance elements 210, 220, 410, 420) are independent of each other and able to operate separately; in an alternative embodiment the EMI suppression device 400 comprises only one of the third and fourth cable-end inductance elements 410, 420 while the other configuration is kept unchanged.

Each of the above-disclosed embodiments may further comprise a high-voltage testing circuit for a high-voltage test; for instance, the embodiment of FIG. 1 may comprise a high-voltage testing circuit (not shown) set between the first and/or second cable-end inductance element(s) and the chassis ground for a high-voltage test. Besides, each of the mentioned inductance elements could be a normal inductor or a bead, could be constant or adjustable in its inductance, and could be integrated into the transformer or connected with the transformer externally. Furthermore, a circuit (e.g. a capacitor or a protection circuit) could be set between the said inductance element and ground. Finally, as it is described in the preceding paragraphs, people of ordinary skill in the art can choose features in different embodiments by the teaching and/or suggestion of this specification to accomplish different kinds of implementations of the present invention while the amount of transformer could be one or more, and the central taps of the windings of two sides of a transformer could be connected to a circuit-end inductance element and a cable-end inductance element respectively.

Figure 5:
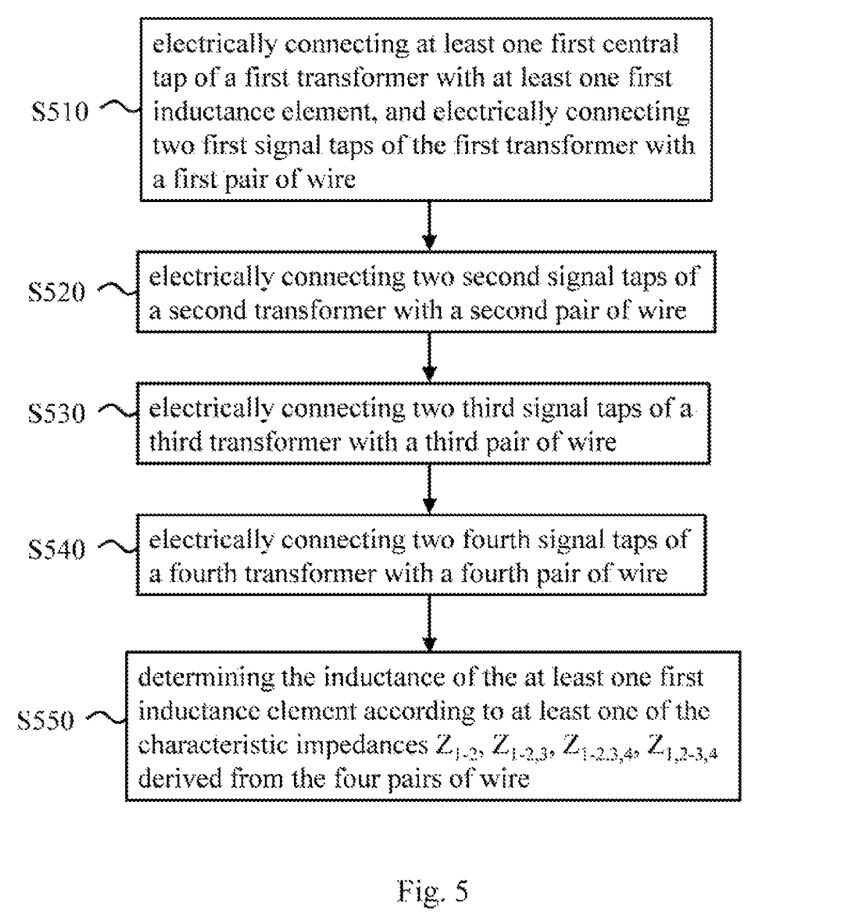
FIG. 5 illustrates an embodiment of the EMI suppression method of the present invention for network transmission.

In addition to the above-discussed EMI suppression device, the present invention also discloses an EMI suppression method for network transmission, which is capable of determining the inductance of an inductance element for EMI suppression. As it is shown in FIG. 5, an embodiment of the EMI suppression method comprises the following steps:

Step S510: electrically connecting at least one first central tap of a first transformer with at least one first inductance element, and electrically connecting two first signal taps of the first transformer with a first pair of wire.

Step S520: electrically connecting two second signal taps of a second transformer with a second pair of wire.

Step S530: electrically connecting two third signal taps of a third transformer with a third pair of wire.

Step S540: electrically connecting two fourth signal taps of a fourth transformer with a fourth pair of wire.

Step S550: In consideration of every kinds of existence of common mode noise, determining the inductance of the at least one first inductance element according to at least one of the following characteristic impedances: the characteristic impedance $Z_{1-2}$ derived from the first and second pairs of wire (when common mode noise exists between the first and second pairs of wire), the characteristic impedance $Z_{1-2,3}$ derived from the first pair of wire and the parallel connection of the second and third pairs of wire (when common mode noise exists between the first pair of wire and the combination of the second and third pairs of wire), the characteristic impedance $Z_{1-2,3,4}$ derived from the first pair of wire and the parallel connection of the second, third and fourth pairs of wire (when common mode noise exists between the first pair of wire and the combination of the second, third and fourth pairs of wire), and the characteristic impedance $Z_{1,2-3,4}$ derived from the parallel connection of the first and second pairs of wire and the parallel connection of the third and fourth pairs of wire (when common mode noise exists between the combination of the first and second pairs of wire and the combination of the third and fourth pairs of wire). The value of each of the characteristic impedances could be a nominal value, a detected value, or a value derived from the impedance of each concerned pair of wire in view of the relevant front-end and/or back-end circuits.

On the basis of the above description, in addition to the first transformer, the central tap of any of the other transformers could be connected with an inductance element for the reduction of common mode noise while the inductance of this inductance element could be determined in a way similar to that of the mentioned embodiment. For instance, the above-described embodiment may further comprise the following steps: electrically connecting at least one second central tap of the second transformer with at least one second inductance element; electrically connecting at least one third central tap of the third transformer with at least one third inductance element; electrically connecting at least one fourth central tap of the fourth transformer with at least one fourth inductance element; and determining the inductance of the second, third and fourth inductance elements according to at least one of the aforementioned four characteristic impedances $Z_{1-2}$, $Z_{1-2,3}$, $Z_{1-2,3,4}$, $Z_{1,2-3,4}$. More specifically, in a simplified circumstance without considering other peripheral resistance (e.g. the impedance of circuit board traces, the impedance of transformers, and etc.), providing the inductance of each of the first, second, third and fourth inductance elements in this instance is Z, when common mode noise exists between the first and second pairs of wire, the equivalent impedance observed by the transmission cable (i.e. the cable composed of the first through fourth pairs of wire such as a twisted pair of wire for Ethernet communication) will be Z+Z=2Z, and thus the common mode noise can be restrained due to the impedance match if the equivalent impedance 2Z is equal to the characteristic impedance $Z_{1-2}$ derived from the first and second pairs of wire, that is to say $Z=(Z_{1-2})/2$; similarly, when common mode noise exists between the combination of the first and second pairs of wire and the combination of the third and fourth pairs of wire, the equivalent impedance observed by the transmission cable will be $[1/(Z+Z)]+[1/(Z+Z)]=(Z/2)= Z$, and therefore the common mode noise can be restrained if this equivalent impedance Z is equal to the characteristic impedance $Z_{1,2-3,4}$ derived from the parallel connection of the first and second pairs of wire and the parallel connection of the third and fourth pairs of wire. More circumstances could be derived from the above instance. Of course, the present method invention can take the peripheral resistance such as impedances of traces and transformers into consideration for the determination of inductance; since the traces contribute less to the inductance determination and the influence of the transformers could be derived from the circuit configuration and the related parameters by those of ordinary skill in the art, the detail is therefore omitted.

To sum up, the EMI suppression device and method of the present invention for network transmission have at least the following advantages: effectively reducing common mode noise for EMI suppression; appropriately determining the inductance of inductance elements; and uncomplicated solution while giving consideration to costs.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An electromagnetic interference (EMI) suppression device for network transmission, comprising:
   a first transformer including a first circuit-end central tap operable to receive a first circuit signal from two first circuit-end signal taps, and a first cable-end central tap operable to receive a first cable signal from two first cable-end signal taps;
   a second transformer including a second circuit-end central tap operable to receive a second circuit signal from two second circuit-end signal taps, and a second cable-end central tap operable to receive a second cable signal from two second cable-end signal taps;
   a first circuit-end inductance element, coupled between the first circuit-end central tap and a system ground, operable to reduce the common mode noise of the first circuit signal; and a second circuit-end inductance element, coupled between the second circuit-end central tap and the system ground, operable to reduce the common mode noise of the second circuit signal, wherein the first and second circuit-end inductance elements are independent of each other and operate separately.

2. The EMI suppression device of claim 1, further comprising:

a first cable-end inductance element, coupled between the first cable-end central tap and a chassis ground, operable to reduce the common mode noise of the first cable signal; and a second cable-end inductance element, coupled between the second cable-end central tap and the chassis ground, operable to reduce the common mode noise of the second cable signal, wherein the first and second cable-end inductance elements are independent of each other and operate separately.

3. The EMI suppression device of claim 2, further comprising:

a third transformer including a third circuit-end central tap operable to receive a third circuit signal from two third circuit-end signal taps, and a third cable-end central tap operable to receive a third cable signal from two third cable-end signal taps;

a fourth transformer including a fourth circuit-end central tap operable to receive a fourth circuit signal from two fourth circuit-end signal taps, and a fourth cable-end central tap operable to receive a fourth cable signal from two fourth cable-end signal taps;

a third circuit-end inductance element, coupled between the third circuit-end central tap and the system ground, operable to reduce the common mode noise of the third circuit signal; and a fourth circuit-end inductance element, coupled between the fourth circuit-end central tap and the system ground, operable to reduce the common mode noise of the fourth circuit signal, wherein the first, second, third and fourth circuit-end inductance elements are independent of each other and operate separately.

4. The EMI suppression device of claim 3, further comprising:

a third cable-end inductance element, coupled between the third cable-end central tap and the chassis ground, operable to reduce the common mode noise of the third cable signal; and a fourth cable-end inductance element, coupled between the fourth cable-end central tap and the chassis ground, operable to reduce the common mode noise of the fourth cable signal, wherein the first, second, third and fourth cable-end inductance elements are independent of each other and operate separately.

5. The EMI suppression device of claim 2, further comprising: a high-voltage testing circuit, coupled between the first and/or the second cable-end inductance element(s) and the chassis ground, operable to execute a high-voltage test.

6. The EMI suppression device of claim 1, wherein the first and second circuit-end inductance elements are beads.

7. An electromagnetic interference (EMI) suppression device for network transmission, comprising:

a first transformer including a first cable-end central tap operable to receive a first cable signal from two first cable-end signal taps, and a first circuit-end central tap operable to receive a first circuit signal from two first circuit-end signal taps;

a first cable-end inductance element, coupled between the first cable-end central tap and a chassis ground, operable to reduce the common mode noise of the first cable signal; and a first circuit-end inductance element, coupled between the first circuit-end central tap and a system ground, operable to reduce the common mode noise of the first circuit signal.

8. The EMI suppression device of claim 7, further comprising:

a second transformer including a second cable-end central tap operable to receive a second cable signal from two second cable-end signal taps, and a second circuit-end central tap operable to receive a second circuit signal from two second circuit-end signal taps;

a second cable-end inductance element, coupled between the second cable-end central tap and the chassis ground, operable to reduce the common mode noise of the second cable signal; and a second circuit-end inductance element, coupled between the second circuit-end central tap and the system ground, operable to reduce the common mode noise of the second circuit signal, wherein the first and second cable-end inductance elements are independent of each other and function separately while the first and second circuit-end inductance elements are independent of each other and function separately.

9. An electromagnetic interference (EMI) suppression method for network transmission, comprising the following steps:

electrically connecting at least one first central tap of a first transformer with at least one first inductance element, and electrically connecting two first signal taps of the first transformer with a first pair of wire;

electrically connecting two second signal taps of a second transformer with a second pair of wire;

electrically connecting two third signal taps of a third transformer with a third pair of wire;

electrically connecting two fourth signal taps of a fourth transformer with a fourth pair of wire; and determining the inductance of the at least one first inductance element according to at least one of the characteristic impedance derived from the first and second pairs of wire, the characteristic impedance derived from the first pair of wire and the parallel connection of the second and third pairs of wire, the characteristic impedance derived from the first pair of wire and the parallel connection of the second, third and fourth pairs of wire, and the characteristic impedance derived from the parallel connection of the first and second pairs of wire and the parallel connection of the third and fourth pairs of wire.

10. The EMI suppression method of claim 9, further comprising the following steps:

electrically connecting at least one second central tap of the second transformer with at least one second inductance element;

electrically connecting at least one third central tap of the third transformer with at least one third inductance element;

electrically connecting at least one fourth central tap of the fourth transformer with at least one fourth inductance element; and determining the inductance of the second, third and fourth inductance elements according to at least one of the said four characteristic impedances.

* * * * *